(12) United States Patent
Chu et al.

(10) Patent No.: US 6,365,498 B1
(45) Date of Patent: Apr. 2, 2002

(54) INTEGRATED PROCESS FOR I/O REDISTRIBUTION AND PASSIVE COMPONENTS FABRICATION AND DEVICES FORMED

(75) Inventors: Tsung-Yao Chu, Taipei; Ying-Nan Wen, Hsin-chu; Szu-Wei Lu, Hsinchu, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/418,651

(22) Filed: Oct. 15, 1999

(51) Int. Cl.[7] .................................. H01L 21/44
(52) U.S. Cl. .................. 438/612; 438/381; 438/628
(58) Field of Search .......................... 438/612, 614, 438/382, 384, 381, 628

(56) References Cited

U.S. PATENT DOCUMENTS

| | | | | |
|---|---|---|---|---|
| 3,907,620 A | * | 9/1975 | Abraham | 438/384 |
| 5,874,770 A | * | 2/1999 | Saia | 257/536 |
| 5,933,752 A | * | 8/1999 | Yanagida | 438/613 |
| 6,025,647 A | * | 2/2000 | Shenoy | 257/775 |
| 6,111,317 A | * | 8/2000 | Okada | 257/737 |
| 6,121,104 A | * | 9/2000 | Dierschke | 438/382 |
| 6,197,613 B1 | * | 3/2001 | Kung | 438/106 |

OTHER PUBLICATIONS

Lin, A.W., "Taiwan foundry for System–In_processor", Jan. 2000, IEEE, pp. 197–204.*

* cited by examiner

Primary Examiner—John F. Niebling
Assistant Examiner—Stacy Whitmore
(74) Attorney, Agent, or Firm—Tung & Associates

(57) ABSTRACT

The present invention discloses an integrated method for I/O redistribution and in-situ passive components fabrication such that passive components such as resistors and capacitors can be formed simultaneously during the I/O redistribution process. Only minor modifications in the I/O redistribution process need to be made for accomplishing the present invention method. In the method, an adhesion layer formed of a high resistance material such as TiW, TiN, NiCr,or NiV can be used to connect between connective traces and to function as passive resistors. Passive capacitors can be formed by the additional deposition steps of a dielectric layer and a conductive metal layer on top of an existing connective trace formed on a bonding pad.

13 Claims, 2 Drawing Sheets

INTEGRATED PROCESS FOR I/O REDISTRIBUTION AND PASSIVE COMPONENTS FABRICATION AND DEVICES FORMED

FIELD OF THE INVENTION

The present invention generally relates to an I/O redistribution process for an integrated circuit (IC) chip or wafer level package and more particularly, relates to an I/O redistribution process performed on an IC chip that is integrated with a process of forming passive components such as thin film resistors or thin film capacitors on the chip, and the devices thus formed.

BACKGROUND OF THE INVENTION

In the fabrication of IC devices, semiconductor chips are frequently attached to other chips or other electronic structures such as a printed circuit board. The attachment of the chip is frequently accomplished by a wire bonding process or a flip chip attachment method. In a wire bonding process, each of a series of I/O bump terminal on a chip that is built on an aluminum bonding pad is sequentially bonded to the connecting pads on a substrate. In a flip chip attachment method, all the I/O bumps on the semiconductor chip are terminated with a solder material. For instance, a frequently used solder material is a lead rich, i.e., 97% lead/3% tin high melting temperature solder alloy. In the bonding process, a semiconductor chip is flipped over with the solder bumps aligned and placed in a reflow furnace to effect all the I/O connections to bonding pads on a substrate.

A major processing advantage that is made possible by the flip chip bonding process is its applicability to very high density I/O connections and its high reliability in the interconnects formed when compared to a wire bonding process. Moreover, the wire bonding process also has limitations in the total number of I/O interconnections that can be made in high performance devices.

A limiting factor for using the flip chip bonding process is the fine pitch bonding pads that are frequently required for wire bonding on modem high density devices. For instance, in a high density memory device, bonding pads that are arranged along the periphery of the device may have a pitch, or spacing, as small as 100 $\mu$m. At such narrow spacing, it is difficult and costly to accomplish the bonding process to the pads by using solder bumps in a flip chip bonding technique, taken into consideration that solder bumps in this case are of low profile, making underfill process extremely difficult. Besides, a high density substrate which is very costly is required for flip chip bonding a device with a fine pitch I/O.

In order to bond high density IC devices that have peripheral I/O bonding pads with small pitch, i.e., in the range of approximately 100 $\mu$m, an I/O redistribution process must first be carried out before the formation of the solder bumps. In an I/O redistribution process, the peripheral I/O bonding pads are redistributed by connective traces to area array I/O bonding pads. This is shown in FIG. 1.

As shown in FIG. 1, IC chip 10 that is equipped with peripheral I/O bonding pads 12 which have a pitch X between the pads as small as 100 $\mu$m. Through an I/O redistribution process, a multiplicity of connective traces 14 are formed to redistribute the peripheral bonding pads 12 to area array bonding pads 16. It should be noted that the pitch between the area array bonding pads 16 are greatly increased, i.e., to the extent of approximately three times the pitch between the peripheral bonding pads 12 in this example. The significantly larger pitch between the area array bonding pads 16 allows flip chip bonding to be connected on a low cost substrate manufactured by traditional process. The I/O redistribution process used on modem high density IC devices is therefore an important fabrication step to first enable the device to be solder bumped and then bonded to another chip or to a printed circuit board in a flip chip bonding process. The formation of the connective traces 14 between the various pairs of bonding pads enables the I/O redistribution process to be accomplished. On a module or system, passive components are always included to improve the electrical performance.

It is therefore an object of the present invention to provide an integrated process for I/O redistribution and for forming thin film passive components such as resistors and capacitors simultaneously during the redistribution process encountered in flip chip bumping and wafer level package.

It is a further object of the present invention to provide an integrated process for I/O redistribution and simultaneously forming thin film resistors and capacitors on the connective traces between the bonding pads.

It is another further object of the present invention to provide an integrated process for I/O redistribution and passive components fabrication by utilizing an adhesion layer deposited of a high resistance material for forming the passive components.

It is yet another object of the present invention to provide an integrated process for I/O redistribution and passive components fabrication by utilizing an adhesion layer deposited between the connective traces of a material such as TiW, TiN or any other high resistance materials.

It is still another object of the present invention to provide an integrated process for I/O redistribution and passive components fabrication by utilizing an adhesion layer that is deposited of a high resistance material by a sputtering technique to a thickness between 100 A and 5000 A It is still another further object of the present invention to provide an integrated circuit device that has bonding pads formed in an I/O redistribution process that includes a high resistance material layer deposited between connective traces and functions as a passive resistor.

It is yet another further object of the present invention to provide an integrated circuit device that has bonding pads formed in an I/O redistribution process which includes a bottom electrode, a dielectric and a top electrode forming a passive capacitor on the connective traces.

SUMMARY OF THE INVENTION

In accordance with the present invention, an integrated process for I/O redistribution and passive components fabrication is provided. In the process described below, thin film resistors are fabricated during the I/O redistribution process, and two photolithographic steps are involved. The first photolithographic step is used to relocate the bonding pads, for example, from peripheral to area array configuration. The second photolithographic step is used to form thin film resistors on the connective traces connecting original bonding pads and relocated bonding pads.

In a preferred embodiment, an integrated I/O redistribution and passive components fabrication process can be carried out by the steps of first providing an IC wafer that can be made out of silicon or other semiconducting materials, depositing an adhesion layer on top of the bonding pads and the passivation layer, depositing a conductive layer on top of the adhesion layer, coating a first photoresist layer on the conductive layer, then patterning and etching to define relocated bonding pads and connective traces contacting and connecting original bonding pads and relocated bonding pads. The process is then followed by coating a second photoresist layer, patterning to expose only those segments of connective traces which are then formed into thin film resistors by etching away the top conductive layer and exposing the adhesion layer below. A passivation layer is then deposited on the wafer, and patterned to expose the relocated bonding pads. The wafer is now ready for solder bumping, or any other packaging process.

The adhesion layer utilized can be deposited of a material selected from the group consisting of TiW, TiN, Ti, Cr, NiCr, NiV, $Ta_2N$, $W_2N$, TaAl, TaTi, TaSi and polysilicon. The layer can be deposited by a sputtering technique to a thickness of between about 100 A and about 5000 A. The conductive layer can be deposited of Cu or any other highly conductive metal. The etching process for removing the adhesion layer and the conductive layer can be a wet or dry etch process. The method may further include the step of, after etching away part of the conductive layer between the I/O pads, patterning and etching the adhesion layer such that a passive resistor of a predetermined width and shape can be formed. One of such predetermined shape for achieving high resistivity is a serpentine shape.

The present invention is further directed to an integrated circuit (IC) device that has bonding pads needed to be redistributed by an I/O redistribution process which includes a multiplicity of bonding pads formed on a top surface of the device, at least two connective traces formed of a conductive metal contacting and connecting between at least two pairs of the multiplicity of bonding pads, and a high resistance material layer deposited on top of the IC device providing electrical communication between the at least two connective traces. The device may further include bonding pads formed in an area array. The at least two connective traces each connecting between a peripheral I/O pad and an area array I/O pad. The at least two connective traces can be formed of aluminum or copper or any other high electrical conductivity metal. The at least two connective traces may also be formed over at least two bonding pads that are made of substantially aluminum. The at least two connective traces are formed over at least two bonding pads with an adhesion layer and a conductive layer therein between. The adhesion layer can be formed of a high resistance material for use as a passive resistor. The device further includes a layer of dielectric material embedding the multiplicity of bonding pads for providing electrical insulation therein between. The high resistance material layer can be deposited on top of the dielectric material layer for forming the passive resistor.

In an alternate embodiment, the present invention provides an integrated process for I/O redistribution and passive capacitors fabrication that includes the steps of first providing a substrate that has at least two bonding pads formed thereon, then forming a first dielectric layer covering the at least two bonding pads and providing electrical insulation therein between, forming contact windows on the at least two bonding pads exposing the conductive material, depositing an adhesion layer on top of the at least two bonding pads and the passivation layer, depositing a conductive layer on top of the adhesion layer, coating a first photoresist layer on the conductive layer and patterning to expose areas for forming a connective trace between the at least two bonding pads, depositing a first layer of a conductive metal and forming the connective trace, removing the first photoresist layer, coating a second photoresist layer covering an area between the connective traces, etching away the adhesion layer and the conductive layer from areas not covered by the connective traces and by the second photoresist layer, removing the second photoresist layer, conformally depositing and patterning a second dielectric layer substantially covering the first layer of conductive metal and leaving a contact region uncovered, conformally depositing and patterning a second layer of a conductive metal on top of the second dielectric layer insulated from the first layer of conductive metal, and providing electrical contacts to the contact region of the first layer of conductive metal and to the second layer of conductive metal. The adhesion layer is normally deposited of a high resistance material similar to that utilized in the preferred embodiment. The first and second layer of conductive metal can be deposited of copper or any other high conductivity metals. The first layer of conductive metal can be patterned into a bottom electrode, while the second layer of conductive metal can be patterned into a top electrode for the passive capacitor.

BRIEF DESCRIPTION OF THE DRAWINGS

Other objects, features and advantages of the present invention will become apparent upon consideration of the specification and the appended drawings, in which:

FIG. 2D is an enlarged, cross-sectional view of the present invention device of FIG. 2C showing two conductive traces and a passive resistor formed therein between.

FIG. 2E is an enlarged, plane view of an alternate embodiment of the present invention device showing two conductive traces and a serpentine-shaped passive resistor formed therein between.

DETAILED DESCRIPTION OF THE PREFERRED EMBODIMENTS

The present invention discloses an integrated method for I/O redistribution and passive components fabrication wherein passive components such as thin film resistors or thin film capacitors can be fabricated in-situ on the connective traces during the I/O redistribution process. The integration of the fabrication process for passive components and for I/O redistribution is highly desirable for several reasons. First, a large space on the printed circuit board onto which the IC device is mounted can be saved due to the fact that, with the present invention technology, the resistors and capacitors are built into the IC chip. Secondly, when thin film resistors and thin film capacitors are built on the connective traces on an IC chip during an I/O redistribution process, only a nominal increase in processing steps is required. Thirdly, when a passive resistor is fabricated simultaneously with the connective traces, the magnitude of the resistor formed can be advantageously controlled by the width and the shape of the high resistance film deposited.

In present invention, during an I/O redistribution process for connecting peripheral bonding pads to area array bonding pads, the method for forming the connective traces can be modified to form thin film resistors or thin film capacitors simultaneously. In preparing connective traces for I/O redistribution, an adhesion layer is first deposited onto a passivation layer in which the bonding pads are situated and insulated. A conductive metal is then deposited on top of the adhesion layer to prepare the surface for electroplating of copper or other highly conductive metals. The adhesion layer is normally deposited by a sputtering technique of a high resistance material such as TiW, TiN, Ti, Cr, $Ta_2N$, $W_2N$, TaAl, TaTi, TaSi or polysilicon. The adhesion layer is then patterned by a photolithography method to a suitable width or shape.

In fabricating a passive capacitor simultaneously with an I/O redistribution process, a copper trace may be used as the bottom electrode of the capacitor. A dielectric material layer is then deposited on top of the bottom electrode layer and patterned by a photolithography process to form the capacitor dielectric. An end portion of the bottom electrode is not covered by the dielectric layer such that electrical connection can be made to the bottom electrode. A top electrode is then deposited and patterned of a second conductive metal layer on top of the dielectric layer. Even though copper has been found to be an advantageous material for use as the electrodes for the capacitor, any other highly conductive metal may also be used.

Figure 1:
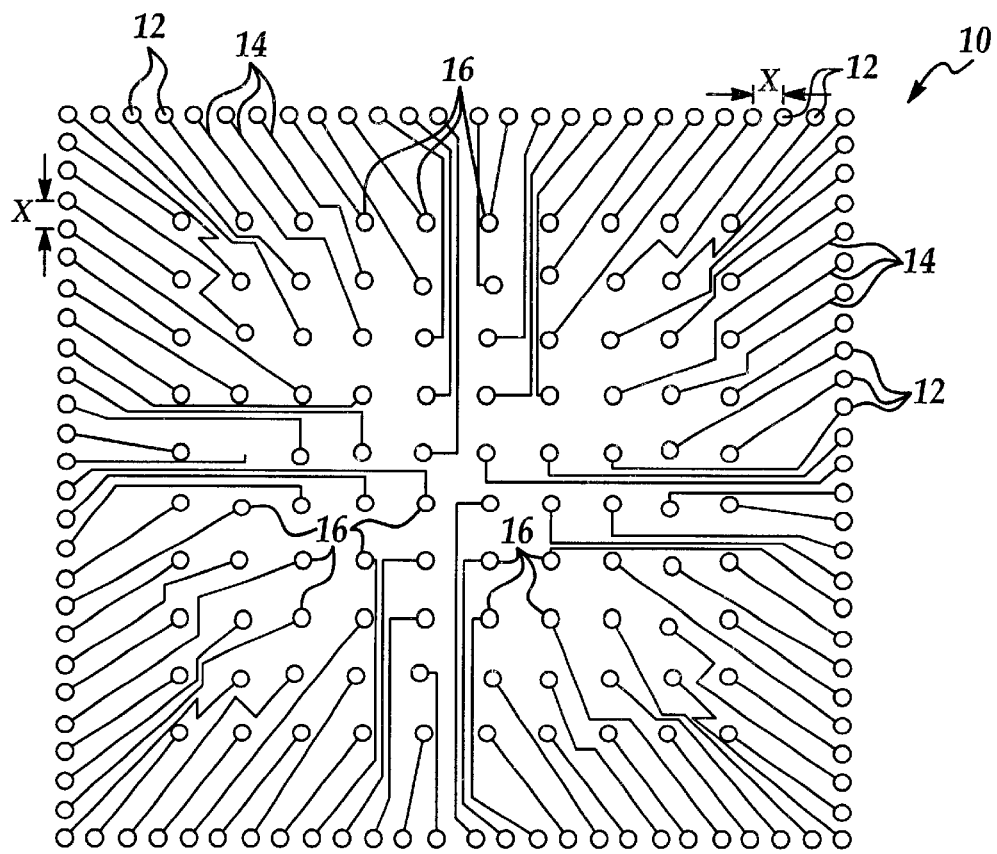
FIG. 1 is a plane view of a conventional high density integrated circuit device after an I/O redistribution process.
Figure 2A:
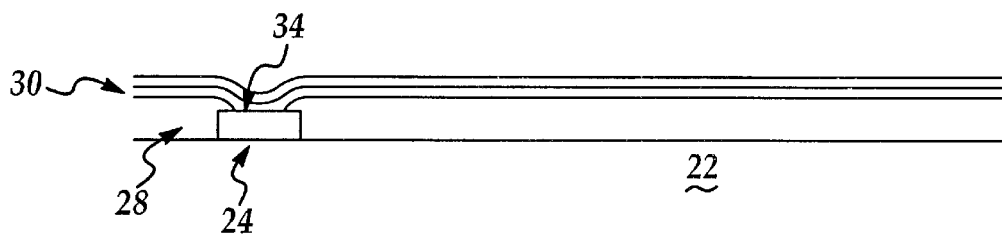
FIG. 2A is an enlarged, cross-sectional view of a present invention IC device having bonding pads, a passivation layer, an adhesion layer and a conductive layer deposited thereon.
Figure 2B:
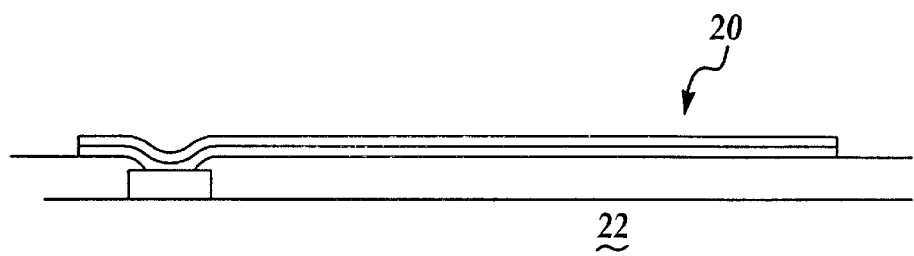
FIG. 2B is an enlarged, cross-sectional view of the present invention device of FIG. 2A having patterned on top exposing areas for the formation of relocated bonding pads and conductive traces connecting the original bonding pads and relocated bonding pads.
Figure 2C:
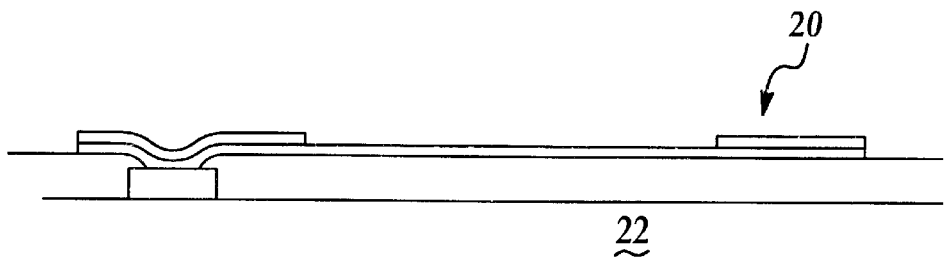
FIG. 2C is an enlarged, cross-sectional view of the present invention device of FIG. 2B with a passive resistor formed out of conductive traces by etching away part of conductive layer.
Figure 2D:
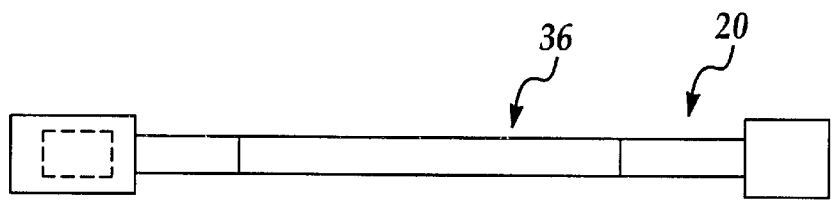
Figure 2E:
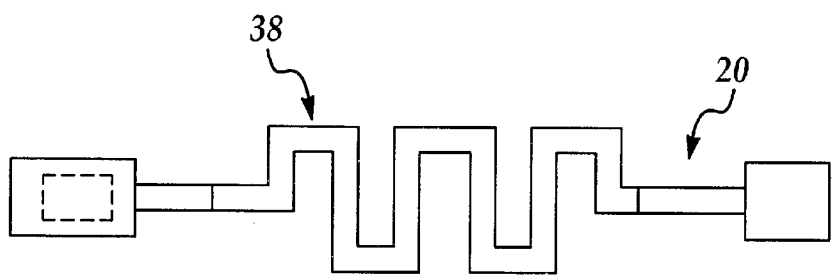
Figure 2F:
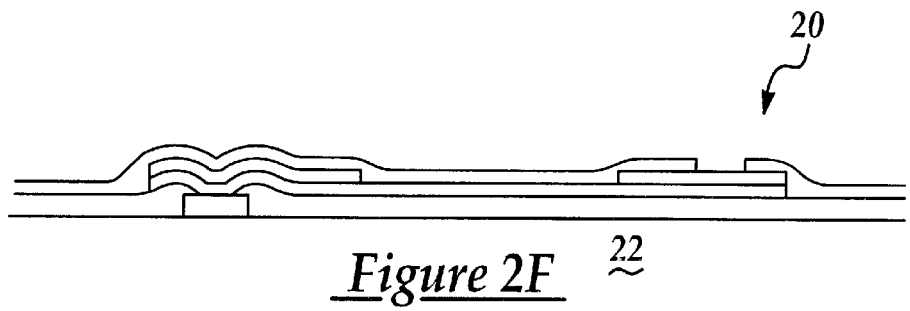
FIG. 2F is an enlarged, cross-sectional view of the present invention device of FIG. 2C with passivation layer being deposited and patterned to define relocated bonding pads.
Figure 3:
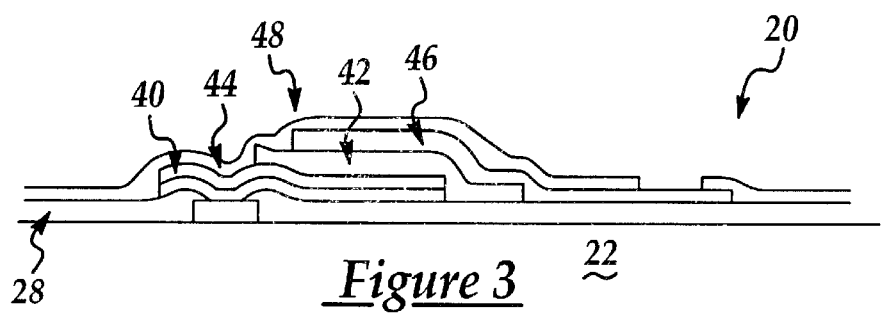
FIG. 3 is an enlarged, cross-sectional view of the present invention device having a passive capacitor formed on top of a connective trace.

In the following descriptions, the method for in-situ forming of passive resistors in an I/O redistribution process is exemplified in FIGS. 2A~2F, while the method for in-situ forming of a passive capacitor in an I/O redistribution process is shown in FIG. 3. It should be noted that while only one embodiment is shown in each fabrication processes, the spirit of the invention can be applied to any other variations of the specifically illustrated embodiments.

Referring initially to FIG. 2A, wherein a present invention IC device 20 is shown. The IC device 20 is built on a silicon substrate 22. Aluminum bonding pad 24, or bonding pads formed of other highly conductive metal are first formed by a metal deposition process followed by a photolithographic patterning method. After the formation of the bonding pad 24, a passivation layer 28 is deposited on top of the bonding pad 24 for insulation purpose. Photolithographic method is then used to pattern windows on the bonding pad 24 through the passivation layer 28 such that a conductive surface on the bonding pads is exposed. Exposed top surface 34 is then covered by an adhesion layer 30 in a sputtering deposition process. The adhesion layer 30 can be advantageously deposited of a high electrical resistance material such as TiW, TiN, Ti, Cr, $Ta_2N$, $W_2N$, TaAl, TaTi, TaSi or polysilicon. A suitable thickness for the adhesion layer deposited by a sputtering technique is between about 100 A and about 5000 A, and preferably between about 200 A and about 1000 A. While the resistance achieved by the present invention passive resistors formed between the connective traces may be smaller than those normally utilized on the PC board, the resistance can be suitable adjusted by the shape 36 or length 38 of the adhesion layer. The present invention novel method can be accomplished by making minimal number of changes in presently used I/O redistribution process.

FIG. 3 illustrates the present invention method of in-situ forming a passive capacitor simultaneously with an I/O redistribution process. On top of the present invention IC device 20, a first formed copper trace 40 is used as a bottom electrode by patterning in a photolithography process. On top of the copper trace 40, a dielectric material layer is then deposited to a suitable thickness of between about 500 A and about 5000A. The dielectric layer 42 is then photolithographically formed into a capacitor dielectric 42 wile exposing the end portion 44 of the copper trace 40 such that electrical connection can be later made to the bottom electrode. In the final step of the process, a second conductive metal layer such as copper may be deposited on top of the dielectric layer 42 for forming the upper electrode 46 photolithographically. A passive capacitor 48 is then completed on top of the connective trace 40. It should be noted that the desired capacitance for the capacitor 48 can be suitably adjusted by the area of the electrodes and by the thickness of the capacitor dielectric.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention.

The embodiments of the invention in which an exclusive property or privilege is claimed are defined as follows:

1. An integrated process for I/O redistribution and passive components fabrication comprising the steps of:
   providing an IC wafer,
   depositing an adhesion layer on top of said IC wafer,
   depositing a conductive layer on top of said adhesion layer,
   coating a first photoresist layer on said conductive layer and patterning to expose areas for forming relocated bonding pads and conductive traces connecting between original bonding pads and relocated bonding pads,
   removing said first photoresist layer,
   coating a second photoresist layer, and patterning to expose areas of said connective traces,
   etching away said conductive layer from areas not covered by said second photoresist layer such that said remaining adhesion layer functions as a resistor between said traces,
   removing said second photoresist layer,
   depositing and patterning a passivation layer to define the relocated bonding pads.

2. An integrated process for I/O redistribution and passive components fabrication according to claim 1, wherein said adhesion layer is deposited of a material selected from the group consisting of TiW, TiN, Ti, Cr, NiCr, NiV, $Ta_2N$, $W_2N$, TaAl, TaTi, TaSi and polysilicon.

3. An integrated process for I/O redistribution and passive components fabrication according to claim 1, wherein said adhesion layer is deposited by a sputtering technique to a thickness between about 100 A and about 5000 A.

4. An integrated process for I/O redistribution and passive components fabrication according to claim 1, wherein said conductive layer is deposited of Cu or Al.

5. An integrated process for I/O redistribution and passive components fabrication according to claim 1, wherein said connective trace is formed of Cu or Al.

6. An integrated process for I/O redistribution and passive components fabrication according to claim 1, wherein said etching process for removing said adhesion layer and said conductive layer is a wet or dry etch process.

7. An integrated process for I/O redistribution and passive components fabrication according to claim 1, wherein said etching process for removing said conductive layer is a dry etch process.

8. An integrated process for I/O redistribution and passive components fabrication according to claim 1 further comprising the step of, after etching away said conductive layer between said connective traces, patterning and etching said adhesion layer such that a passive resistor of a predetermined width and shape is formed.

9. An integrated process for I/O redistribution and passive components fabrication according to claim 1, wherein said predetermined shape is a serpentine shape.

10. An integrated process for I/O redistribution and passive capacitors fabrication comprising the step of:

provided an IC wafer, depositing an adhesion layer on top of said IC wafer, depositing a conductive layer on top of said adhesion layer, coating a photoresist layer on said conductive layer and patterning to form bottom electrodes, removing said photoresist layer, conformally depositing and patterning a dielectric layer substantially covering said bottom electrodes, conformally depositing and patterning a second layer of a conductive metal on top of said dielectric layer insulated from said bottom electrodes, and the second conductive metal layer acting as top electrodes for the passive capacitors, and defining relocated bonding pads and connective traces.

11. An integrated process for I/O redistribution and passive capacitors fabrication according to claim 10, wherein said adhesion layer is deposited of a material selected from the group consisting of TiW, TiN, Ti, Cr, NiCr, NiV, $Ta_2N$, $W_2N$, TaAl, TaTi, TaSi and polysilicon.

12. An integrated process for I/O redistribution and passive capacitors fabrication according to claim 10, wherein said first and second layers of conductive metal are Cu or Al.

13. An integrated process for I/O redistribution and passive capacitors fabrication according to claim 10, wherein said first layer of conductive metal is patterned into a bottom electrode and said second layer of conductive metal is patterned into a top electrode for said passive capacitor.

* * * * *